(12) United States Patent
Ishimoto et al.

(10) Patent No.: US 6,815,993 B1
(45) Date of Patent: Nov. 9, 2004

(54) π/2 PHASE SHIFTER

(75) Inventors: Hisato Ishimoto, Hyogo (JP);
Yoshinori Takahashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 156 days.

(21) Appl. No.: 10/110,203

(22) PCT Filed: Aug. 21, 2000

(86) PCT No.: PCT/JP00/05578

§ 371 (c)(1),
(2), (4) Date: Apr. 17, 2002

(87) PCT Pub. No.: WO02/17485

PCT Pub. Date: Feb. 28, 2002

(51) Int. Cl.[7] .............................................. H03H 11/16
(52) U.S. Cl. ...................................... 327/247; 327/248
(58) Field of Search ................................. 327/247, 248, 327/231, 232, 233, 234, 235, 238, 239, 245, 246, 254, 255

(56) References Cited

U.S. PATENT DOCUMENTS

| | | | | |
|---|---|---|---|---|
| 4,868,428 A | * | 9/1989 | Cooper ......................... | 327/248 |
| 5,251,330 A | * | 10/1993 | Chiba et al. ................. | 327/248 |
| 5,430,711 A | * | 7/1995 | Yamada et al. ............... | 455/91 |

FOREIGN PATENT DOCUMENTS

| JP | 60-109313 | 6/1985 |
|---|---|---|
| JP | 6-252970 | 9/1994 |
| JP | 6-283966 | 10/1994 |
| JP | 7-303028 | 11/1995 |
| JP | 10-313231 | 11/1998 |

OTHER PUBLICATIONS

Yasushi Yamao et al.: "Low power quadrature modulator IC's for digital mobile communications" IEICE Transactions, vol. J76–C–I, No. 11, pp. 453–455 11/93.

* cited by examiner

*Primary Examiner*—Linh M. Nguyen
(74) *Attorney, Agent, or Firm*—Oblon, Spivak, McClelland, Maier & Neustadt, P.C.

(57) ABSTRACT

In a π/2 phase shifter, first and second signals and first and second inverted signals are produced based on input signals. The first and second signals have the same amplitude and are out of phase from each other, and the first and second inverted signals respectively correspond to the first and second signals with their respective phases inverted. A first output signal is produced by adding the first signal and the second signal, and a second output signal is produced by adding the first signal and the second inverted signal. Since the first and second signals have the same amplitude, the first output signal and the second output signal respectively correspond to diagonal lines of a rhombus formed by a vector representing the first signal and a vector representing the second signal. Accordingly, the phase difference between the first and second output signals of the π/2 phase shifter is accurately set to π/2 even when the phase difference between the first and second signals is not π/2.

17 Claims, 11 Drawing Sheets

FROM INPUT LIMITER CIRCUIT 14

TO ADDER CIRCUIT 12

π/2 PHASE SHIFTER

TECHNICAL FIELD

The present invention relates to a π/2 phase shifter. More particularly, the present invention relates to a π/2 phase shifter capable of eliminating the effects of variation of elements in a circuit and parasitic capacitance and stably maintaining the phase difference of π/2 between output signals.

BACKGROUND ART

Recent development of digital mobile communication systems including a mobile phone system shows rapid progress. In the digital mobile communication systems, a roll-off π/4 shift QPSK (Quadrature Phase Shift Keying) method is generally used in order to improve the frequency utilization efficiency.

Generation of a roll-off π/4 shift QPSK signal requires a high-accuracy quadrature modulator. The quadrature modulator is a device for multiplying an input in-phase carrier and an input quadrature carrier having a phase difference of 90° (π/2) from the in-phase carrier by an in-phase-component and a quadrature component (both of which are a base band signal) of a complex envelope signal of a modulated wave, respectively, for output from a synthesizer. Accordingly, a π/2 phase shifter is required which divides an input carrier into two signals, i.e., in-phase (0°) and quadrature (90°=π/2) carrier signals.

Accuracy of the π/2 phase shifter in the quadrature modulator greatly affects modulation accuracy of the quadrature modulator. The reason for this is as follows: if the phase difference between two output signals of the π/2 phase shifter varies from π/2, that is, if quadrature phase error occurs, independency of the in-phase/quadrature signals after synthesis is degraded, causing degradation in modulation due to crosstalk between the in-phase/quadrature signals. In general, in the case of a QPSK signal, quadrature phase accuracy must be within ±3° in order to suppress this degradation to 0.1 dB or less as converted into a carrier-to-noise ratio (C/N).

As such a π/2 phase shifter for use in the quadrature modulator, the structure using a resistive element and a capacitive element is disclosed in, e.g., "Low Power Quadrature Modulator IC's for Digital Mobile Communications" (Yasushi YAMAO et al., IEICE Transactions, '93/11, Vol. J76-C-I, No. 11, pp. 453–455) and "Orthogonal Modulator" (Japanese Patent Laying-Open No. 6-252970).

Referring to FIG. 14, a conventional π/2 phase shifter 40 receives an input signal SIGIN and outputs signals SIGa, SIGb that are out of phase from each other by π/2.

The π/2 phase shifter 40 includes a capacitor 41 coupled between an input node Ni for receiving the input signal SIGIN and a node Nb for outputting one output signal SIGb, and a resistive element 42 coupled between the node Nb and a ground node 45. The π/2 phase shifter 40 further includes a resistive element 43 coupled between the input node Ni and a node Na for outputting the other output signal SIGa, and a capacitor 44 coupled between the node Na and the ground node 45.

The π/2 phase shifter 40 is designed so that the capacitors 41, 44 have the same capacitance value C and the resistive elements 42, 43 have the same resistance value R.

FIG. 15 shows vector representation of an ideal output state of the π/2 phase shifter 40. Referring to FIG. 15, when the phase state of the signals is represented on the X-Y plane, the positive direction of the X axis corresponds to the phase θin (0°) of the input signal SIGIN as a reference.

The phase of the output signal SIGb is advanced by θb from that of the input signal SIGIN (θin) by the capacitor 41 and the resistive element 42. In contrast, the phase of the other output signal SIGa is retarded by θa from that of the input signal SIGIN (θin) by the resistive element 43 and the capacitor 44.

Ideally, by designing the resistance value R and the capacitance value C in FIG. 14 according to the frequency of the input signal SIGIN so that θb=±45° (+π/4) and θa=−45° (−π/4), the phase difference between the output signals SIGb and SIGa, that is, (θb−θa), can be set to π/2.

In other words, phase accuracy of the conventional π/2 phase shifter 40 depends on accuracy of the resistance value of the resistive elements and the capacitance value of the capacitors.

However, when such a π/2 phase shifter is fabricated on LSI (Large Scale Integrated circuit), manufacturing variation in the resistance value and capacitance value of the resistive elements and capacitors formed on the integrated circuit becomes problematic. Moreover, when the π/2 phase shifter 40 having such a structure is used in, e.g., mobile phones using a high-frequency carrier of, e.g., 100 MHz level or higher, the effects of parasitic elements on these circuits also become problematic.

Referring to FIG. 16, in the conventional π/2 phase shifter 40, the capacitor 41 coupled between the node Ni and the node Nb has Rtb1 and Rtb2 corresponding to the electrode resistance of the capacitor. The capacitance value Cb of the capacitor itself is not necessarily equal to the! design value C due to manufacturing variation.

The resistive element 42 coupled between the node Nb and the ground node 45 has a resistance value Rb varying from the design value R depending on the manufacturing variation, and an increased carrier frequency would cause parasitic capacitance Cpb.

Similarly, the resistive element 43 coupled between the node Ni and the node Na actually has a resistance value Ra that is not equal to the design value R due to the manufacturing variation, and operation in a high frequency region would cause parasitic capacitance Cpa. Moreover, the capacitor 44 coupled between the node Na and the ground node 45 actually has a capacitance value Ca that is not necessarily equal to the design value C due to the manufacturing variation, and has resistances Rta1 and Rta2 corresponding to the electrode resistance thereof.

FIG. 17 shows vector representation of the output state of the π/2 phase shifter 40 affected by these problems.

Referring to FIG. 17, as the resistance value and capacitance value of the capacitors 41, 44 and the resistive elements 42, 43 vary from the respective design values due to the manufacturing variation and the effects of the parasitic elements during high-frequency operation, the respective phase differences θb', θa' between the output signals SIGb, SIGa and the input signal SIGIN vary from the respective design values ±45° (+π/4), −45° (−π/4).

This hinders accurate setting of the phase difference between the output signals SIGb and SIGa of the π/2 phase shifter to π/2. when such a π/2 phase shifter is used in, e.g., a quadrature modulator, the phase difference between the output signals of the π/2 phase shifter varies from π/2, degrading independency of in-phase/quadrature signals after synthesis. This results in a degraded image suppression ratio upon demodulation, hindering desired modulation accuracy from being obtained by the quadrature modulator.

DISCLOSURE OF THE INVENTION

It is an object of the present invention to provide the structure of a π/2 phase shifter for accurately adjusting the phase difference between output signals to π/2.

According to the present invention, a π/2 phase shifter includes a phase shifter circuit and a phase difference correction circuit. The phase shifter circuit receives an input signal and an inverted input signal thereof and produces first and second intermediate signals having a same amplitude and being out of phase from each other. The phase shifter circuit further produces first and second inverted intermediate signals respectively corresponding to the first and second intermediate signals with their respective phases inverted. The phase difference correction circuit receives the first and second intermediate signals produced by the phase shifter circuit and the first and second inverted intermediate signals and outputs a set of signals that are out of phase from each other by π/2. The phase difference correction circuit includes an adder circuit for outputting a first output signal obtained by first addition of the first intermediate signal and the second intermediate signal, and a second output signal obtained by second addition of the first intermediate signal and the second inverted intermediate signal.

Preferably, the phase shifter circuit outputs as analog signals the first and second intermediate signals and the first and second inverted intermediate signals. The phase difference correction circuit further includes a first amplitude regulation circuit for making respective amplitudes of the first and second intermediate signals and the first and second inverted intermediate signals from the phase shifter circuit equal to each other. The adder circuit conducts the first and second additions based on the first and second intermediate signals and the first and second inverted intermediate signals which are transmitted through the first amplitude regulation circuit.

Preferably, the phase shifter circuit outputs as digital signals the first and second intermediate signals and the first and second inverted intermediate signals. The phase difference correction circuit further includes a low pass filter for passing therethrough the first and second intermediate signals and the first and second inverted intermediate signals which are digital signals. The adder circuit conducts the first and second additions based on the first and second intermediate signals and the first and second inverted intermediate signals which are transmitted through the low pass filter.

In such a π/2 phase shifter, when represented by vectors, the first output signal and the second output signal that are respectively produced by the first and second additions based on the first and second intermediate signals having the same amplitude and being out of phase from each other correspond to a pair of diagonal lines of a rhombus formed by vectors representing the first and second intermediate signals. Therefore, the phase difference between the first output signal and the second output signal can be accurately set to π/2.

BEST MODE FOR CARRYING OUT THE INVENTION

Figure 1:
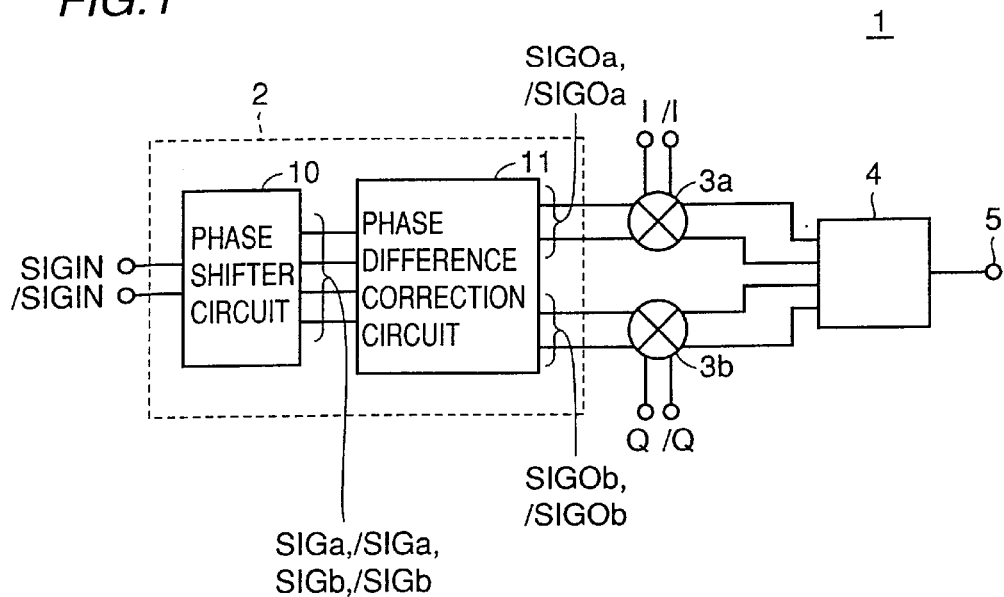
FIG. 1 is a block diagram of the overall structure of a quadrature modulator including a π/2 phase shifter according to an embodiment of the present invention.

Hereinafter, a π/2 phase shifter according to embodiments of the present invention will be described in detail in conjunction with the accompanying drawings. Note that the same or corresponding portions are denoted with the same reference numerals and characters throughout the figures, and description thereof will not be repeated.

(First Embodiment)

Referring to FIG. 1, a quadrature modulator 1 includes a π/2 phase shifter 2 according to the first embodiment of the present invention, double balance mixers 3a, 3b, and a synthesizer 4.

The π/2 phase shifter 2 receives an input signal SIGIN and an inverted signal/SIGIN thereof, and outputs signals SIGOa, SIGOb that are out of phase from each other by π/2, and inverted signals /SIGOa, /SIGOb thereof.

The double balance mixer 3a multiplies the output signals SIGOa, /SIGOa from the π/2 phase shifter 2 by in-phase signals I, /I. The double balance mixer 3b multiplies the output signals SIGOb, /SIGOb from the π/2 phase shifter 2 by quadrature signals Q, /Q. The synthesizer 4 synthesizes the respective outputs of the double balance mixers 3a, 3b for output to a modulation signal output terminal 5.

Figure 14:
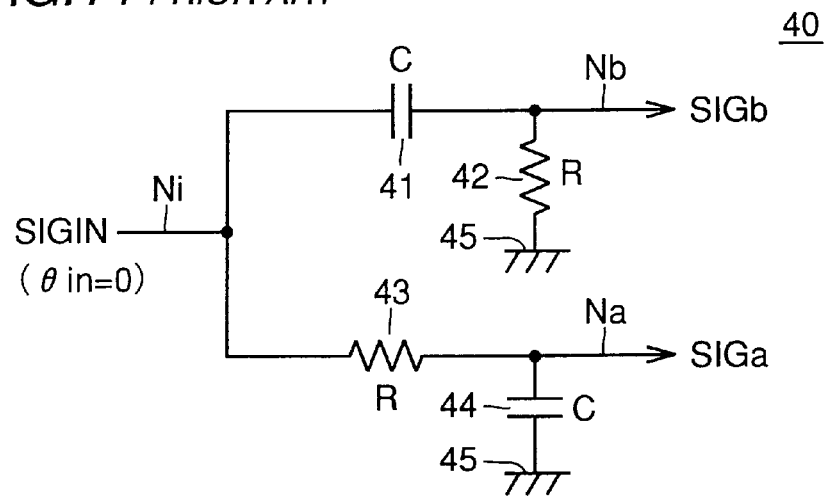
FIG. 14 is a circuit diagram of the structure of a conventional π/2 phase shifter.
Figure 15:
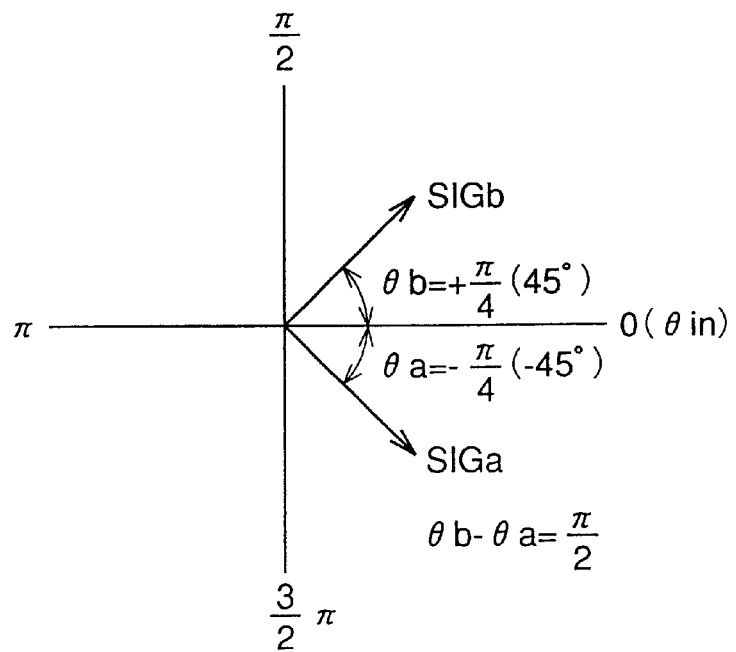
FIG. 15 is a conceptual diagram of the outputs of a π/2 phase shifter in an ideal state.
Figure 16:
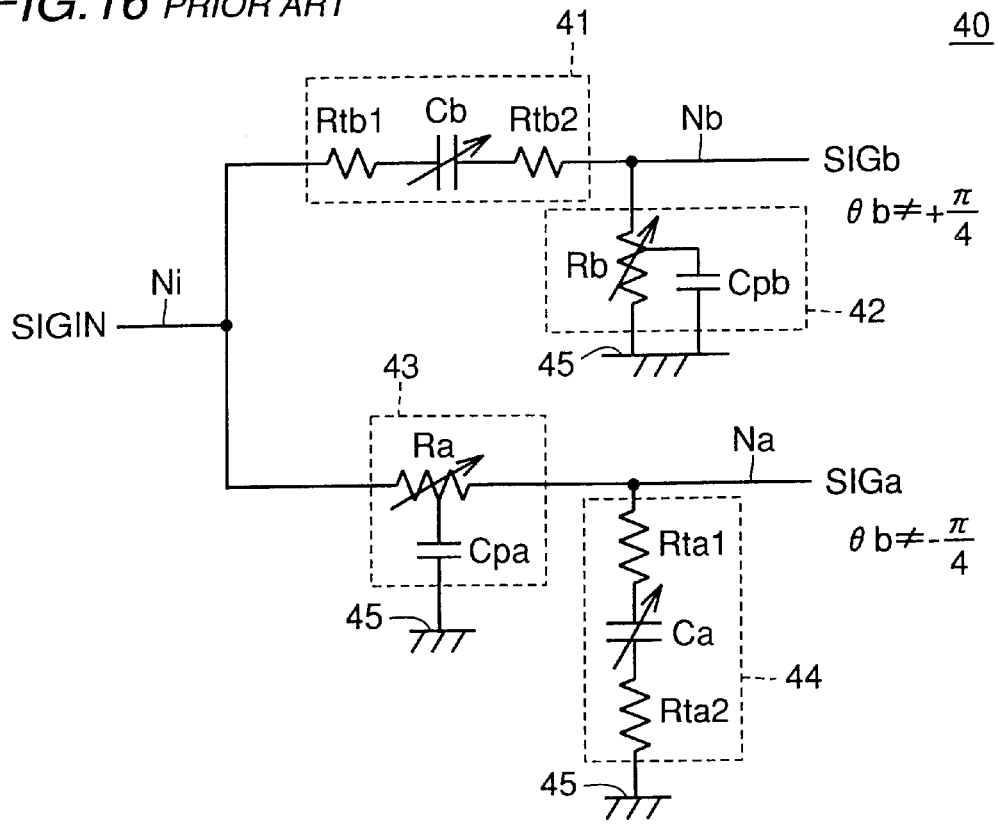
FIG. 16 is a circuit diagram illustrating the problems of the conventional π/2 phase shifter.
Figure 17:
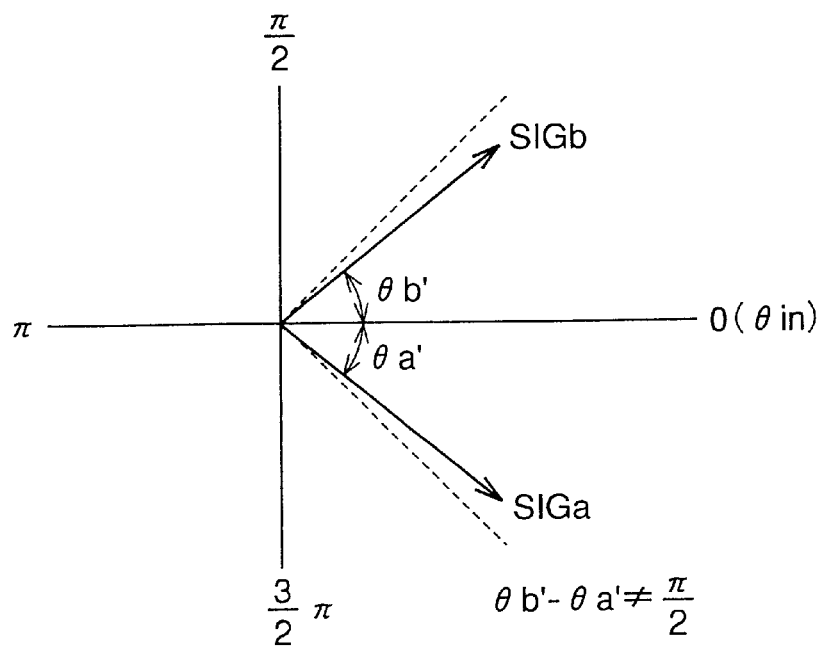
FIG. 17 is a conceptual diagram illustrating the problems of the conventional π/2 phase shifter.

The π/2 phase shifter 2 according to the first embodiment of the present invention includes a phase shifter circuit 10 and a phase difference correction circuit 11. For example, the conventional π/2 phase shifter 40 shown in FIG. 14 may be applied to the phase shifter circuit 10. The phase shifter circuit 10 receives an input signal SIGIN and an inverted signal/SIGIN thereof, and outputs SIGa, SIGb that are out of phase from each other and inverted signals/SIGa, /SIGb thereof.

Note that the π/2 phase shifter according to the first embodiment of the present invention is characterized in that the phase difference between the output signals SIGa and SIGb of the phase shifter circuit 10 need not be π/2, and even if the phase difference therebetween varies from π/2, the phase difference between the output signals SIGOa and SIGOb can be accurately set to π/2 by the phase difference correction circuit 11.

Figure 2:
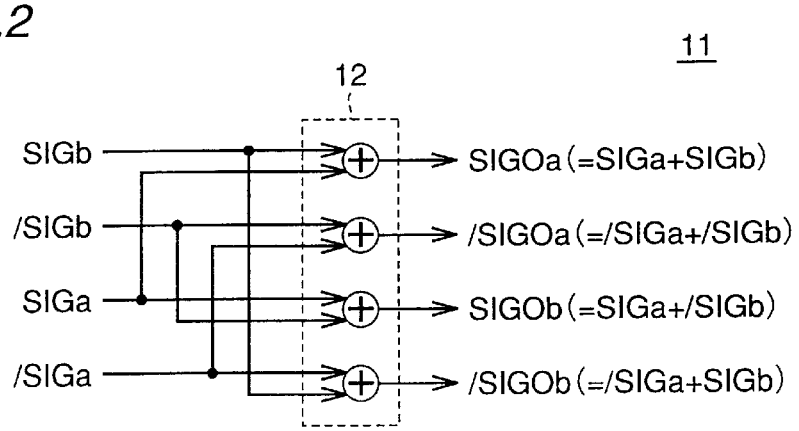
FIG. 2 is a block diagram of the structure of a phase difference correction circuit shown in FIG. 1.

Referring to FIG. 2, the phase difference correction circuit 11 includes an adder circuit 12 for conducting addition of the output signals SIGa, SIGb, /SIGa, /SIGb of the phase shifter circuit 10.

The adder circuit 12 adds the signals SIGa, SIGb to produce an output signal SIGOa, and also adds the signals SIGa, /SIGb to produce an output signal SIGOb.

Figure 3:
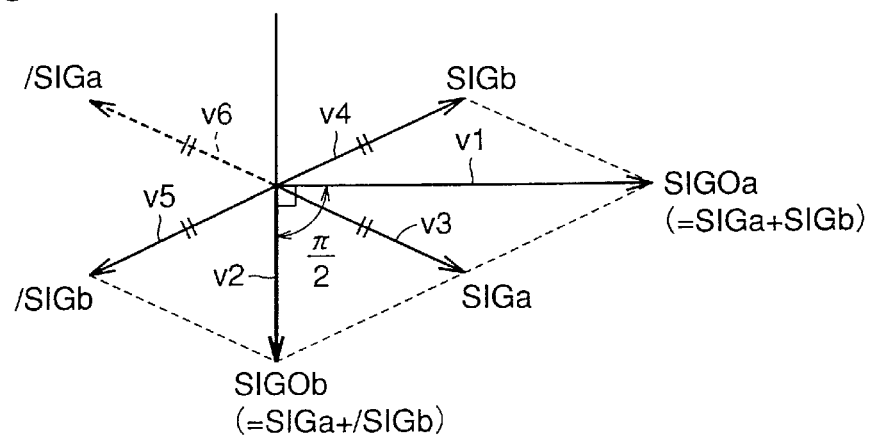
FIG. 3 is a conceptual diagram of the outputs of a π/2 phase shifter according to an embodiment of the present invention.

Referring to FIG. 3, a vector v1 representing the output signal SIGOa is indicated by the sum of vectors v3 and v4 respectively representing the output signals SIGa and SIGb of the phase shifter circuit 10. On the other hand, a vector v2 representing the output signal SIGOb is indicated by the sum of vectors v3 and v5 respectively representing the output signals SIGa and /SIGb of the phase shifter circuit 10.

By making the respective amplitudes of the output signals of the phase shifter circuit 10 equal to each other, the vectors v3, v4 and v5 have the same magnitude. The vectors v1 and v2 thus correspond to a pair of diagonal lines of a rhombus. As a result, as long as the vectors v3 to v5 have the same magnitude, the vectors v1 and v2 are orthogonal to each other, that is, the phase difference between the output signals SIGOa and SIGOb is set to π/2.

The other two output signals/SIGOa and /SIGOb of the adder circuit 12 are respectively represented by the sum of /SIGa (vector v6) and /SIGb (vector v5) and the sum of /SIGa (vector v6) and SIGb (vector v4). Therefore, as long as the vectors v3 to v6 have the same magnitude, the output signal/SIGOa and /SIGOb have an inverted phase of the output signals SIGOa and SIGOb, respectively, so that the phase difference therebetween is π/2.

By thus conducting addition of the signals by using the output signal group of the phase shifter circuit 10 having the same amplitude but being out of phase from each other, the phase difference of π/2 can be accurately maintained between the output signals of the π/2 phase shifter 2.

Hereinafter, a specific structural example of the adder circuit will be described.

Figure 4A:
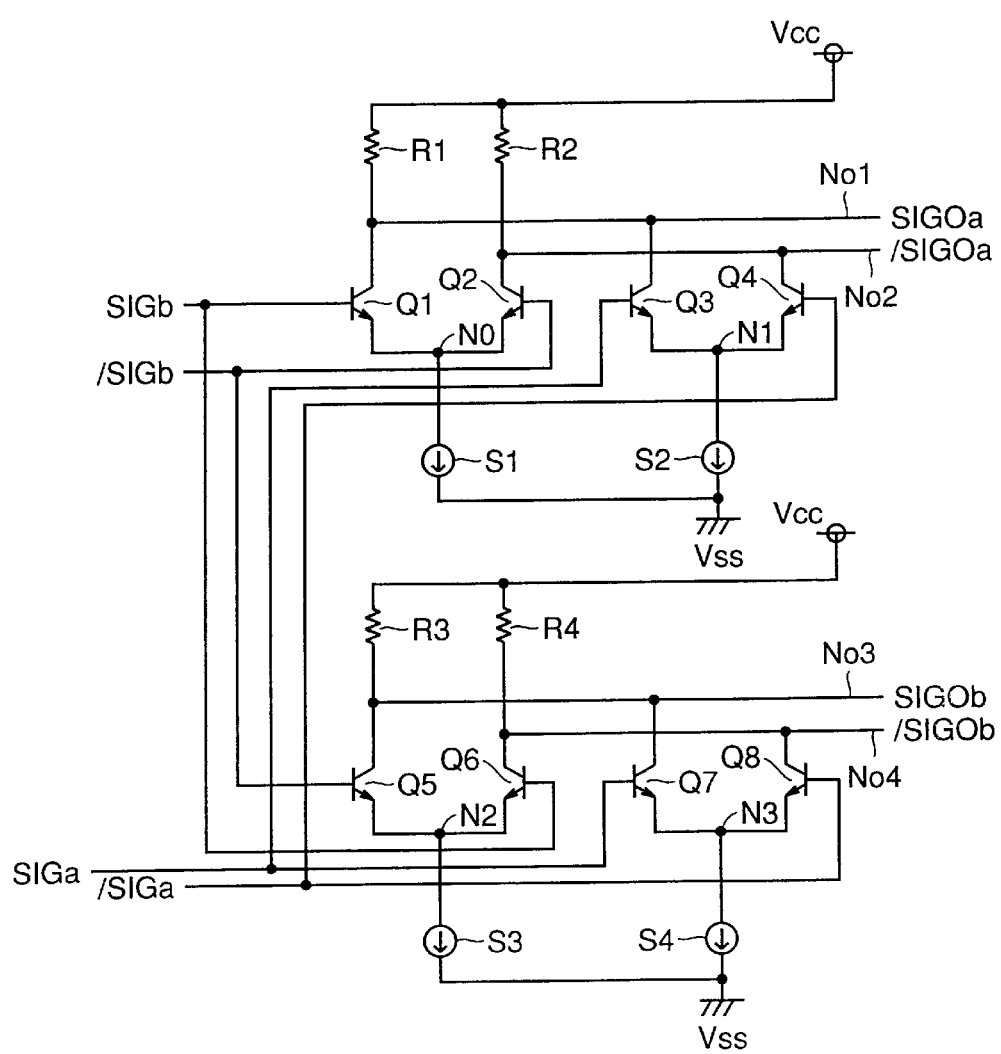
FIG. 4A is a circuit diagram of a first structural example of an adder circuit shown in FIG. 2.

Referring to FIG. 4A, the adder circuit 12 includes a resistive element R1 coupled between a power supply node for supplying a power supply potential Vcc and an output node No1 for outputting an output signal SIGOa, a resistive element R2 coupled between the power supply node and a node No2 for outputting a signal /SIGOa, an NPN transistor Q1 coupled between the node No1 and a node N0, an NPN transistor Q2 coupled between the node No2 and the node N0, an NPN transistor Q3 coupled between the node No1 and a node N1, an NPN transistor Q4 coupled between the node No2 and the node N1, a current source S1 connected between a ground node for supplying a ground potential Vss and the node N0, and a current source S2 connected between the node N1 and the ground node.

Signals SIGb and /SIGb from the phase shifter circuit 10 are respectively applied to the bases of the transistors Q1 and Q2. Similarly, signals SIGa and /SIGa from the phase shifter circuit 10 are respectively applied to the bases of the transistors Q3 and Q4. As a result, a potential is produced on the node No 1 according to the base inputs of the transistors Q1 and Q3, and the result of adding the signals SIGa and SIGb is output as an output signal SIGOa. Similarly, the potential level on the node No2 is determined according to the base inputs of the transistors Q2 and Q4, and the result of adding the outputs/SIGa and /SIGb of the phase shifter circuit 10 is output as an output signal/SIGOa.

Resistive elements R3, R4, NPN transistors Q5, QG, Q7, Q8, and current sources S3, S4 are similarly provided for the nodes No3 and No4 for outputting the signals SIGOb and /SIGOb. The resistive elements R3, R4 correspond to the resistive elements R1, R2 described above, and the NPN transistors Q5, Q6, Q7, Q8 correspond to the NPN transistors Q1, Q2, Q3, Q4 respectively. The current sources S3, S4 respectively correspond to the current sources S1, S2. The current sources S1, S2, S3, S4 are designed to have the same current supply capability.

Such a structure enables the adder circuit 12 to conduct addition of the output signals of the phase shifter circuit 10 as described in connection with FIG. 2.

Figure 4B:
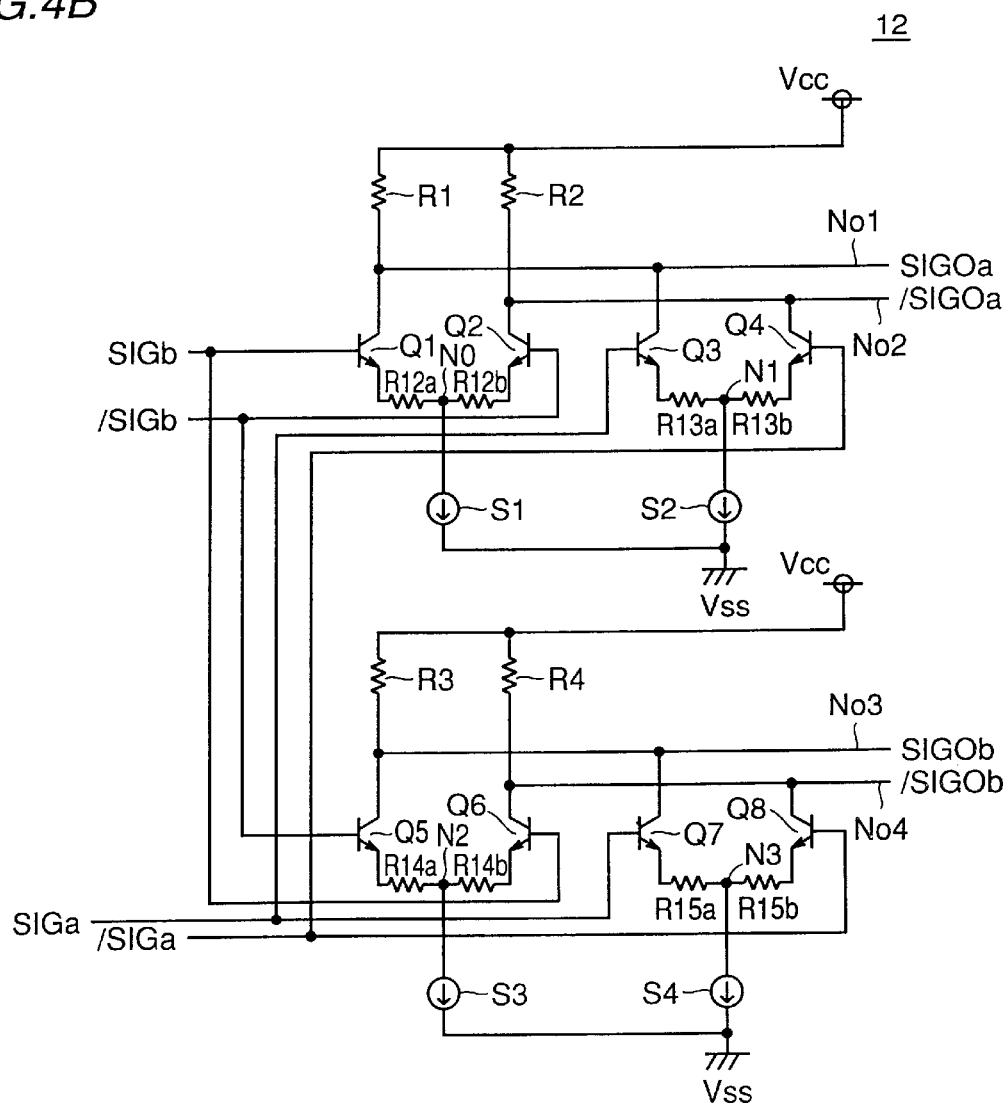
FIG. 4B is a circuit diagram of a second structural example of the adder circuit shown in FIG. 2.

As shown in FIG. 4B, the adder circuit 12 may include resistive elements R12a to R15b between the transistors Q1 to Q8 and the corresponding current sources. More specifically, the resistive elements R12a, R12b are respectively provided between the node N0 and the transistors Q1, Q2. Similarly, the resistive elements R13a, R13b are respectively provided between the node N1 and the transistors Q3, Q4, the resistive elements R14a, R14b are respectively provided between a node N2 and the transistors Q5, QG, and the resistive elements R15a, R15b are respectively provided between a node N3 and the transistors Q7, Q8.

Such a structure increases the input dynamic range of the adder circuit 12, enabling desired addition to be conducted even when the input signals SIGa, /SIGa, SIGb, /SIGb to the adder circuit 12 have an increased amplitude.

Figure 4C:
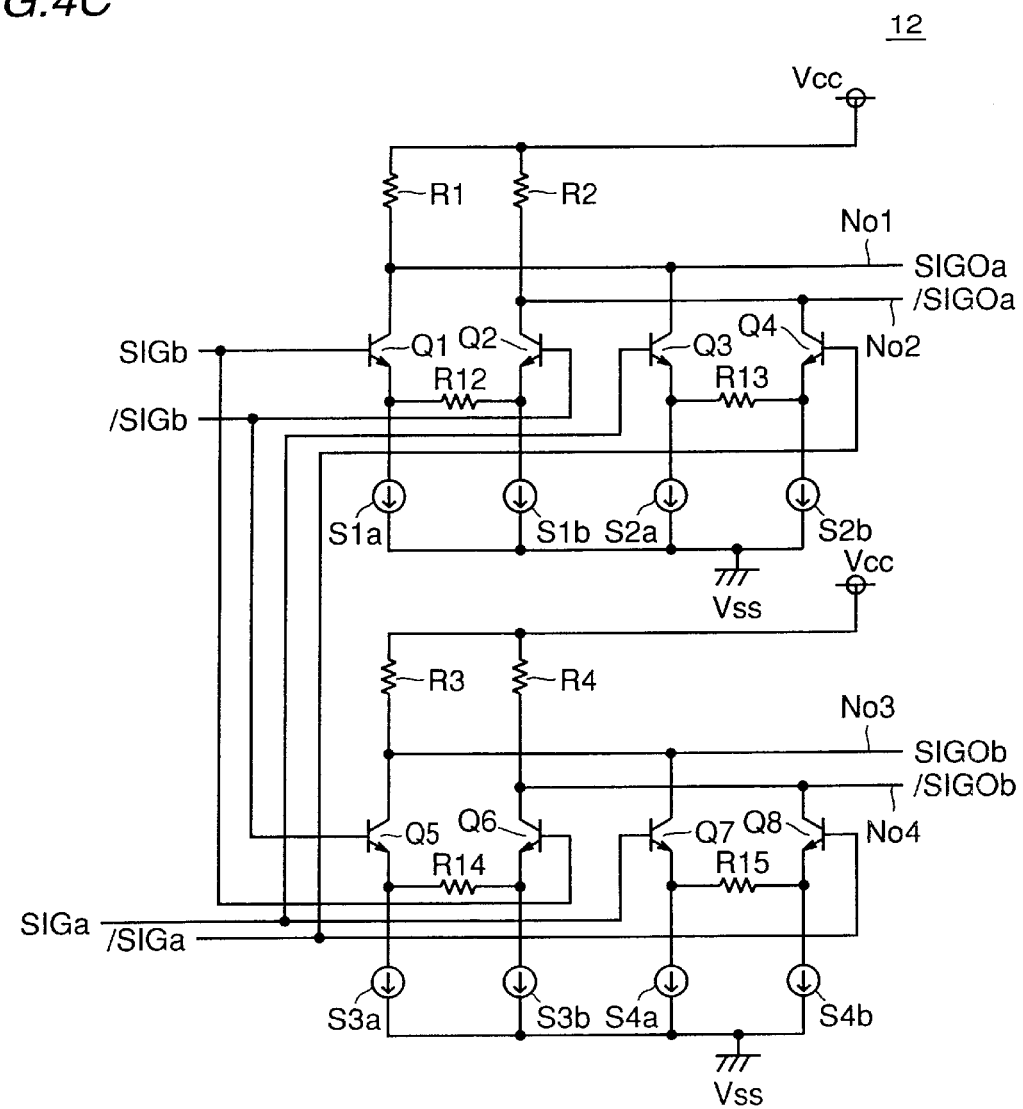
FIG. 4C is a circuit diagram of a third structural example of the adder circuit shown in FIG. 2.

Referring to FIG. 4C, the adder circuit 12 may include current sources S1a to S4b corresponding to the respective transistors Q1 to Q8, and resistive elements R12 to R15 for improving linearity of the transistor operation so as to increase the input dynamic range. The current sources S1a to S4b are designed to have the same current supply capability. More specifically, the resistive element R12 is coupled between the emitters of the transistors Q1 and Q2, and the resistive element R13 is coupled between the emitters of the transistors Q3 and Q4. Similarly, the resistive element R14 is coupled between the emitters of the transistors Q5 and Q6, and the resistive element R15 is coupled between the emitters of the transistors Q7 and Q8.

Such a structure enables desired addition to be conducted even when the signals SIGa, /SIGa, SIGb, /SIGb have an increased amplitude, as in the case of the structure of FIG. 4B.

Figure 4D:
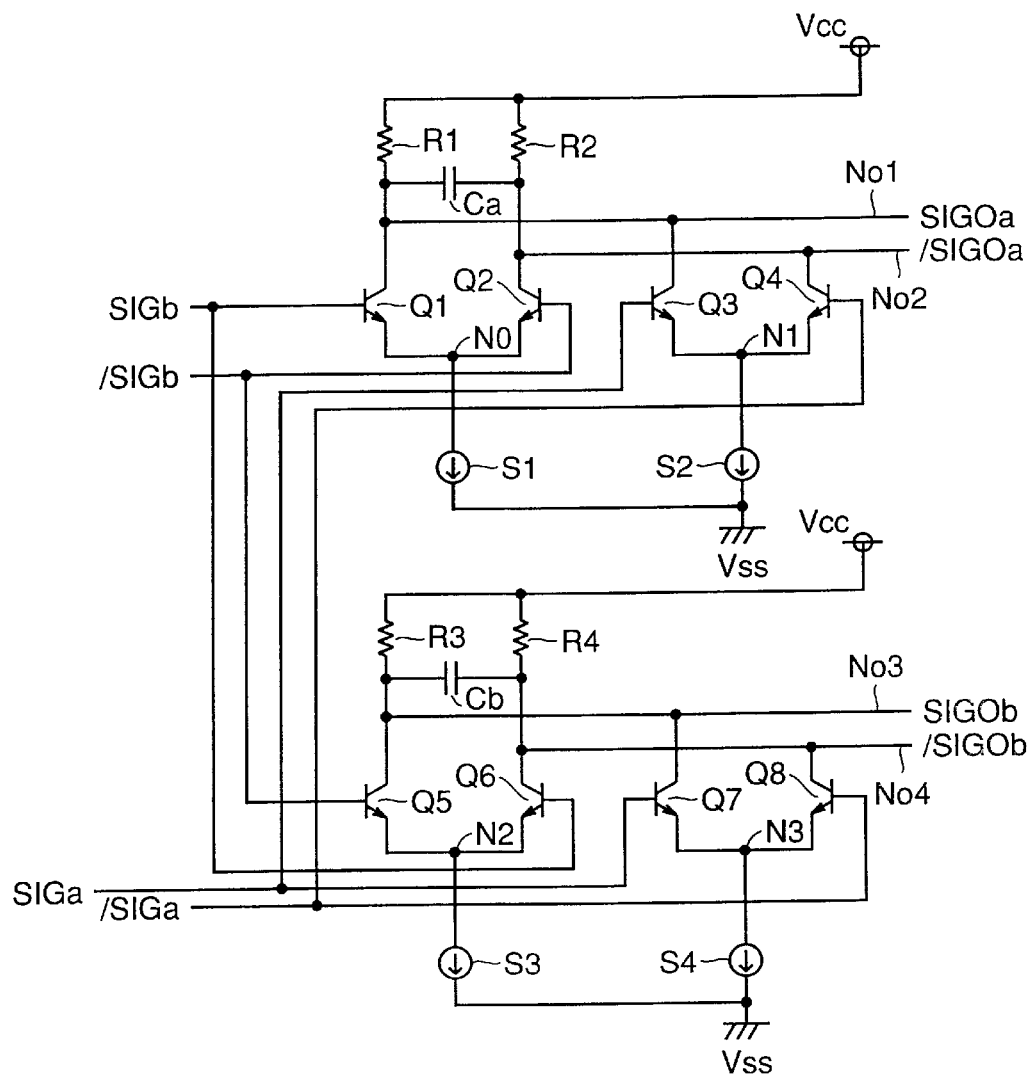
FIG. 4D is a circuit diagram of a fourth structural example of the adder circuit shown in FIG. 2.

Referring to FIG. 4D, the adder circuit 12 may further include a capacitor Ca coupled between the nodes No1 and No2, and a capacitor Cb coupled between the nodes No3 and No4, in addition to the circuit structure shown in FIG. 4A.

Such a structure enables desired addition to be conducted even when the signals SIGa, /SIGa, SIGb, /SIGb are subjected to abrupt change in signal level.

(Second Embodiment)

As described before, in the present invention, it is important for the input signals to the adder circuit to have the same amplitude. Accordingly, the structure for maintaining the phase difference of $\pi/2$ between output signals even when the output signals of the phase shifter circuit 10 have a difference in amplitude will be described in the second embodiment.

Figure 5:
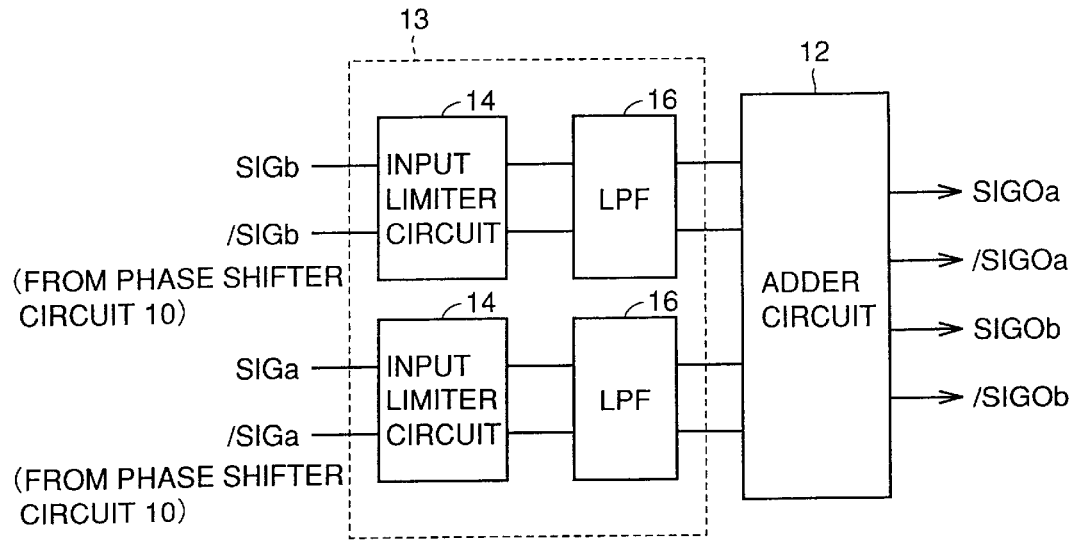
FIG. 5 is a block diagram of the structure of a phase difference correction circuit according to a second embodiment of the present invention.

A $\pi/2$ phase shifter according to the second embodiment of the present invention includes a phase difference correction circuit 21 shown in FIG. 5 instead of the phase difference correction circuit 11 in FIG. 2. The structure of the phase shifter circuit 10 is not limited, as in the case of the first embodiment. However, the structure of the second embodiment is particularly effective for an analog phase shifter circuit 10 for outputting the signals SIGa, SIGb, /SIGa, /SIGb as analog signals.

Referring to FIG. 5, the phase difference correction circuit 21 includes an adder circuit 12 and an amplitude regulation circuit 13 that is provided between the phase shifter circuit 10 and the adder circuit 12. The amplitude regulation circuit 13 includes input limiter circuits 14 for converting the output signals of the phase shifter circuit 14 to a rectangular wave with a constant amplitude so as to make the respective amplitudes equal to each other, and low pass filters 16 for converting the outputs of the corresponding input limiter circuit 14 to analog signals capable of being added in the adder circuit 12.

The input limiter circuits 14 and the low pass filters 16 are provided for the output signals SIGb, /SIGb and SIGa, /SIGa of the phase shifter circuit 10, respectively.

Figure 6:
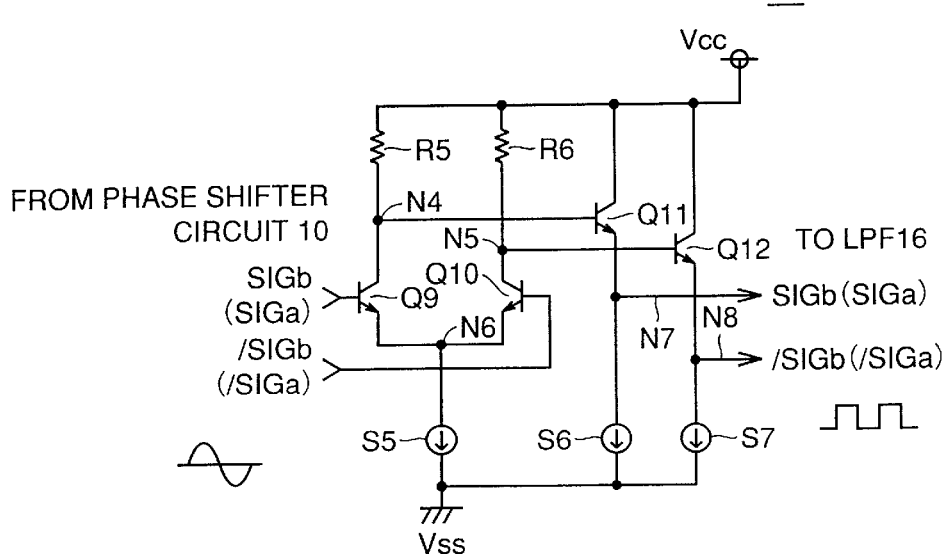
FIG. 6 is a circuit diagram of a structural example of an input limiter circuit shown in FIG. 5.

FIG. 6 exemplarily shows the structure of the input limiter circuit 14 corresponding to the output signals SIGb, /SIGb of the phase shifter circuit 10.

Referring to FIG. 6, the input limiter circuit 14 includes resistive elements R5, R6 respectively coupled between a power supply node and nodes N4, N5, NPN transistors Q9, Q10 respectively electrically coupled between the nodes N4, N5 and a node N6, and a current source S5 coupled between the node N6 and a ground node.

The input limiter circuit 14 further includes an NPN transistor Q11 coupled between the power supply node and a node N7, a current source S6 coupled between the node N7 and the ground node, an NPN transistor Q12 electrically coupled between the power supply node and a node N8, and a current source S7 coupled between the node N8 and the ground node.

The outputs SIGb, /SIGb of the phase shifter circuit 10 are respectively applied to the bases of the transistors Q9, Q10. The output signals SIGb, /SIGb of the analog phase shifter circuit 10 have a sinusoidal waveform.

Potential levels according to the signals SIGb, /SIGb are respectively produced on the nodes N4, N5 in response to the base inputs of the transistors Q9, Q10. The nodes N4, N5 are respectively coupled to the bases of the transistors Q11, Q12 driven by the power supply potential Vcc. As a result, rectangular waves reflecting the phases of the signals SIGb, /SIGb are output to the nodes N7, N8, respectively. The amplitude of the rectangular wave is determined by the product of the current amount passing through the current source S5 and the resistance value of the resistive element R5 (R6) within the range of the ground potential Vss to the power supply potential Vcc. The input limiter circuit 14 is capable of making the respective amplitudes of the signals SIGb, /SIGb from the phase shifter circuit 10 equal to each other while retaining their respective phases.

The same structure can be applied to the input limiter circuit 14 corresponding to the signals SIGa, /SIGa from the phase shifter circuit 10. This enables the output signals of the phase shifter circuit 10 that are out of phase from each other to have the same amplitude.

However, the adder circuit 12 having the structure of FIGS. 4A–4C is incapable of adding the rectangular waves. Accordingly, the rectangular-wave signals having the same amplitude as a result of passing through the input limiter circuit 14 must be applied to the adder circuit 12 with their rising and falling edges blunted.

Figure 7:
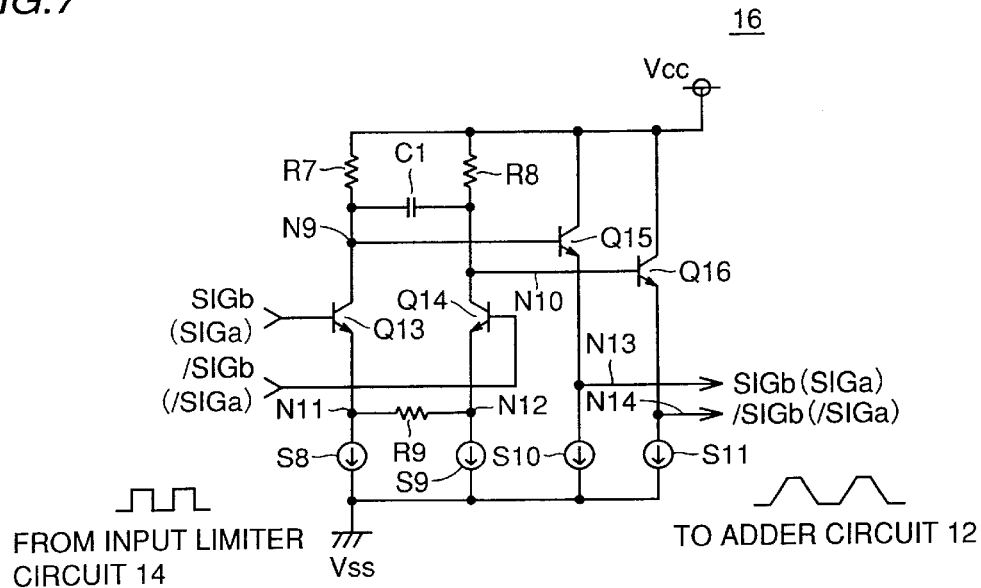
FIG. 7 is a circuit diagram of a structural example of a low pass filter shown in FIG. 5.

FIG. 7 exemplarily shows the structure of the low pass filter 16 corresponding to the signals SIGb, /SIGb output from the input limiter circuit 14.

Referring to FIG. 7, the low pass filter 16 includes resistive elements R7, R8 respectively coupled between the power supply node and nodes N9, N10, an NPN transistor Q13 coupled between the node N9 and a node N11, an NPN transistor Q14 coupled between the node N10 and a node N12, a capacitor C1 coupled between the nodes N9 and N10, a resistive element R9 coupled between the nodes N11 and N12, and current sources S8, S9 respectively coupled between the nodes N11, N12 and the ground node. The signals SIGb, /SIGb converted to rectangular waves by the input limiter circuit 14 are respectively applied to the bases of the transistors Q13, Q14.

The low pass filter 16 further includes NPN transistors Q15, Q16 respectively electrically coupled between the power supply node and nodes N13, N14, and current sources S10, S11 respectively coupled between the nodes N13, N14 and the ground node. The transistors Q15, Q16 have their bases coupled to the nodes N9, N10, respectively.

The transistors Q13, Q14 are turned ON/OFF according to the potential levels of the signals SIGb, /SIGb converted into rectangular waves as a result of passing through the input limiter circuit 14, whereby the respective potential levels on the nodes N9, N10 vary accordingly. At this time, the potential levels on the nodes N9, N10 rise or fall through a low pass filter formed from the capacitor C1 and at least one of the resistive elements R7, R8, R9. Accordingly, as the potential levels of the signals SIGb, /SIGb output from the input limiter circuit 14 vary like a rectangular wave, the potential levels on the nodes N9, N10 responsively vary like a blunted rectangular wave, that is, a sinusoidal wave.

The nodes N9, N10 are respectively coupled to the bases of the transistors Q15, Q16 that are driven by the power supply potential Vcc. Therefore, analog signals, that is, signals SIGb, /SIGb passing through the limiter circuit and having their rising and falling edges blunted while retaining their phases, are respectively output to the nodes N13, N14.

The same structure can be applied to the low pass filter 16 corresponding to the signals SIGa, /SIGa passing thorough the input limiter circuit 14.

Referring back to FIG. 5, in the phase difference correction circuit 21, the input limiter circuits 14 and the low pass filters 16 enable the signals to be regulated to have the same amplitude for input to the adder circuit 12 even when the outputs of the phase shifter circuit 10 have a difference in amplitude. This allows the phase difference between the output signals of the $\pi/2$ phase shifter to be set to $\pi/2$ more accurately.

Note that the independent low pass filters 16 may be omitted by using the circuit structure of FIG. 4D as the adder circuit 12 having a function of the low pass filter.

(Third Embodiment)

Figure 8:
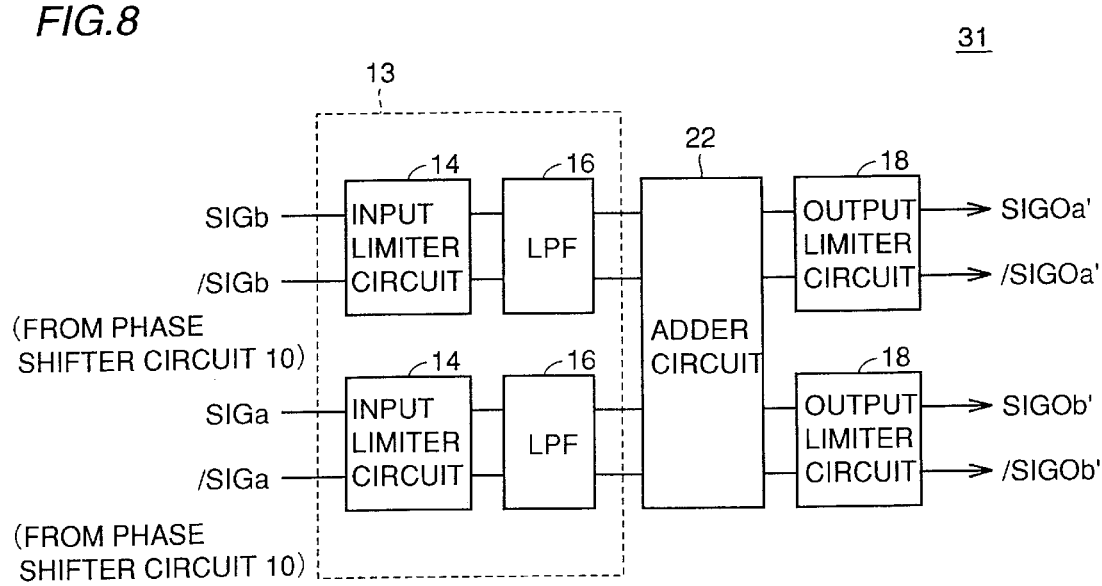
FIG. 8 is a block diagram of the structure of a phase difference correction circuit according to a third embodiment of the present invention.

A π/2 phase shifter according to the third embodiment of the present invention includes a phase difference correction circuit 31 shown in FIG. 8 instead of the phase difference correction circuit 11 in FIG. 2.

Referring to FIG. 8, the phase difference correction circuit 31 includes an amplitude regulation circuit 13 described in connection with FIG. 5, an adder circuit 22, and output limiter circuits 18 for making the respective amplitudes of the output signals of the adder circuit equal to each other.

As in the case of FIG. 5, the input limiter circuits 14 and the low pass filters 16 are provided for the outputs SIGb, /SIGb and SIGa, /SIGa of the phase shifter circuit 10, respectively.

Figure 9:
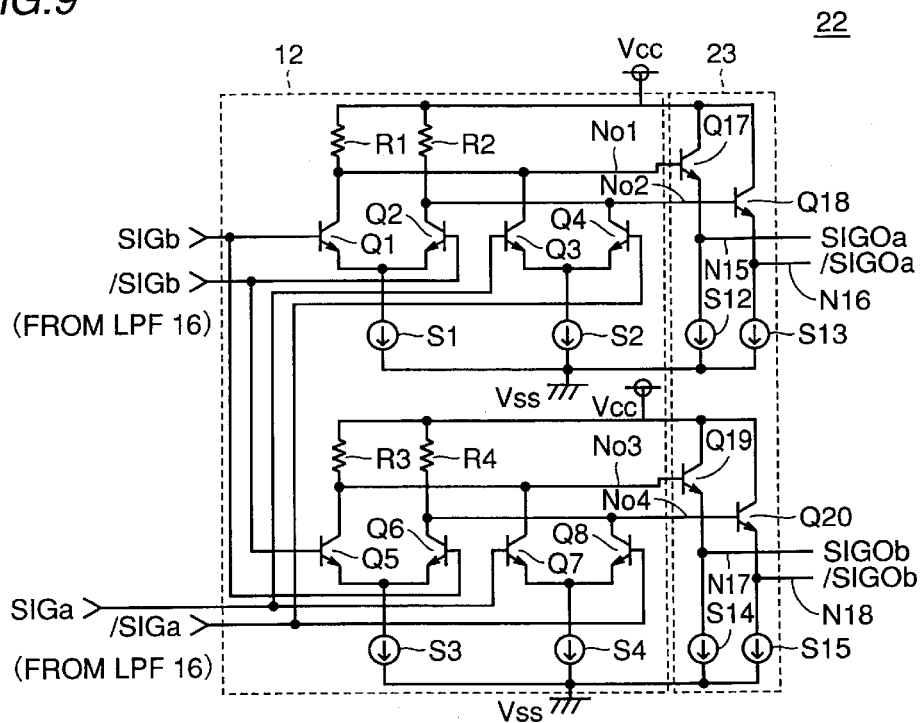
FIG. 9 is a circuit diagram of a structural example of an adder circuit shown in FIG. 8.

Referring to FIG. 9, the adder circuit 22 further includes a signal buffer portion 23 in addition to the structure of the adder circuit 12 in FIG. 4A.

The signal buffer portion 23 includes transistors Q17, Q18, Q19, Q20 having their bases respectively coupled to the nodes No1, No2, No3, No4. The transistors Q17 to Q20 are connected between the power supply node and the ground node through current sources S12 to S15, respectively.

The transistors Q17 to Q20 respectively amplify the output signals SIGOa, /SIGOa, SIGOb, /SIGOb produced on the nodes No1 to No4 for output to the output limiter circuits 18 in the subsequent stage. In view of the output limiter circuits 18 in the subsequent stage, the adder circuit 22 has a function to amplify the output signals resulting from addition, in addition to the adding function of the adder circuit 12 shown in FIG. 4.

Note that, instead of the structure of FIG. 9, the adder circuit 22 may be formed from combination of the circuit structure of the adder circuit 12 shown in FIGS. 4B to 4D and the signal buffer portion 23.

Figure 10:
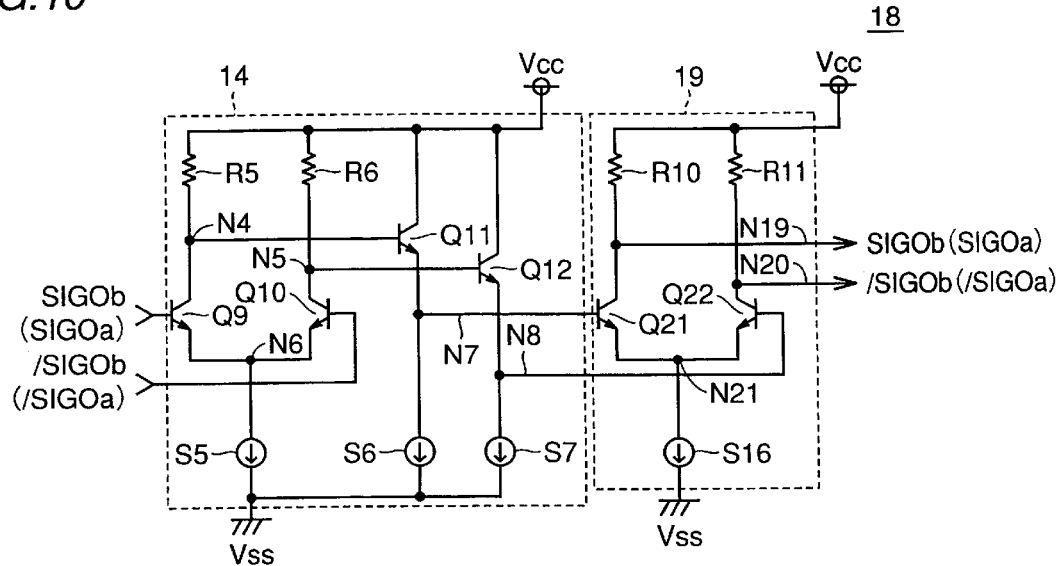
FIG. 10 is a circuit diagram of a structural example of an output limiter circuit shown in FIG. 8.

FIG. 10 exemplarily shows the structure of the output limiter circuit 18 corresponding to the output signals SIGOa, /SIGOa of the adder circuit 22.

Referring to FIG. 10, the output limiter 18 further includes an amplitude regulation portion 19 in addition to the same structure as that of the input limiter circuit 14.

The amplitude regulation portion 19 includes resistive elements R10, R11 respectively connected between the power supply node and nodes N19, N20, NPN transistors Q21, Q22 respectively coupled between the nodes N19, N20 and a node N21, and a current source S16 connected between the node N21 and the ground node. The transistors Q21, Q22 have their bases respectively coupled to the nodes N7, N8.

The amplitude regulation portion 19 is provided in order to reduce the amplitude difference between the output signals of the output limiter circuit 18. Accordingly, in the case where signals having a small enough amplitude difference are respectively output to the nodes N7, N8 by using the same structure as that of the input limiter circuit 14, the amplitude regulation portion 19 may be omitted.

Such a structure enables the signals having the same amplitude to be output to the nodes N19, N20 while retaining the respective phases of the output signals SIGOb, /SIGOb from the adder circuit 22.

The same structure can be applied to the output limiter circuit corresponding to the output signals SIGOa, /SIGOa of the adder circuit 22.

Such a structure enables the output signals SIGOa, SIGOb, /SIGOa, /SIGOb passing through the output limiter circuit 18 to have the same amplitude with the phase difference between the matched signals being set to π/2.

Thus, a constant input amplitude is applied to the circuitry provided in the stage subsequent to the π/2 phase shifter according to the third embodiment of the present invention, for example, the double balance mixers 3a, 3b in the quadrature modulator 1, whereby a high image suppression ratio can be assured upon demodulation.

(Fourth Embodiment)

Figure 11:
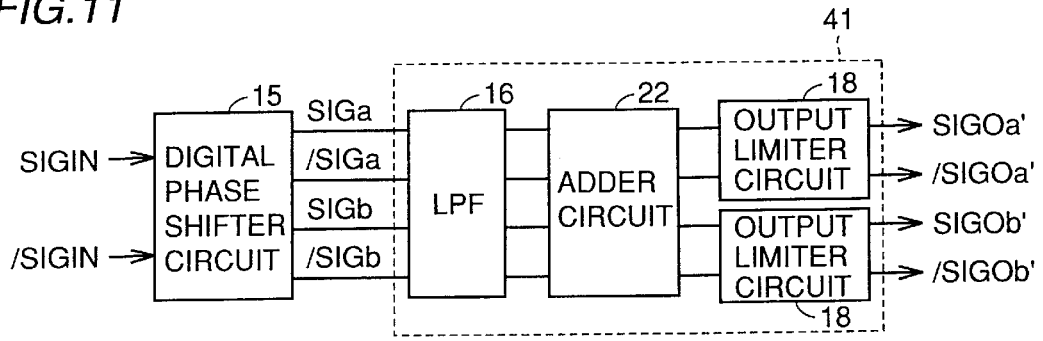
FIG. 11 is a block diagram of the structure of a π/2 phase shifter according to a fourth embodiment of the present invention.

Referring to FIG. 11, a π/2 phase shifter according to the fourth embodiment of the present invention includes a digital phase shifter circuit 15 and a phase difference correction circuit 41.

The digital phase shifter circuit 15 is not an analog phase shifter circuit using an RC element as described in the related art, but a digital phase shifter circuit using a flip-flop.

Figure 12:
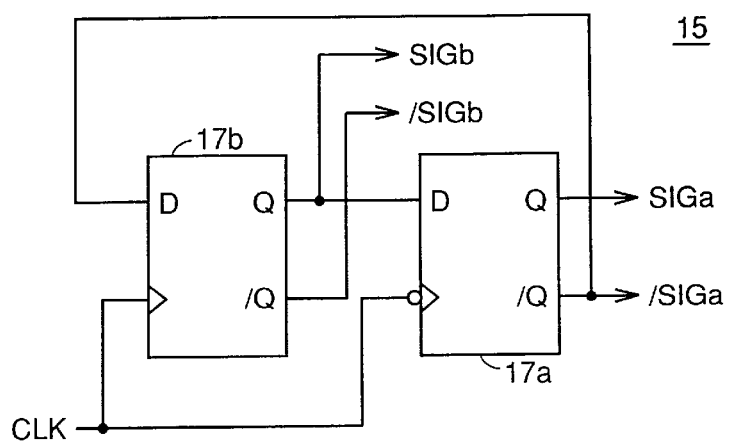
FIG. 12 is a circuit diagram of a structural example of a digital phase shifter shown in FIG. 11.

Referring to FIG. 12, the digital phase shifter circuit 15 includes D-type flip-flops 17a, 17b. The D-type flip-flop 17b operates in response to rising edge of a clock signal CLK, and the D-type flip-flop 17a operates in response to falling edge of the clock signal CLK.

The D-type flip-flop 17a outputs signals SIGa and /SIGa from its Q and /Q terminals, respectively. The signal /SIGa is applied to the D terminal of the D-type flip-flop 17b. The D-type flip-flop 17b outputs signals SIGb and /SIGb from its Q and /Q terminals, respectively. The clock signal CLK is thus frequency-divided to be reflected on the signals SIGa, /SIGa, SIGb, /SIGb.

Figure 13:
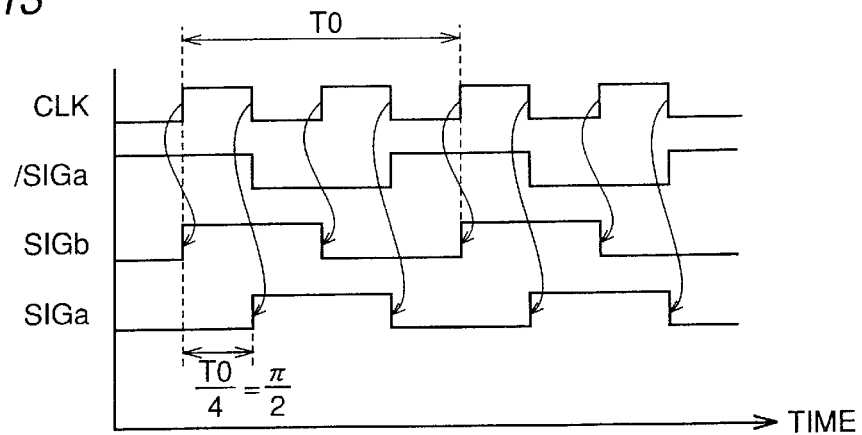
FIG. 13 is a timing chart illustrating operation of the digital phase shifter shown in FIG. 12.

Referring to FIG. 13, the cycle T0 of the signals SIGa, /SIGa, SIGb, /SIGb is twice that of the clock signal CLK. In response to rising edge of the clock signal CLK, the signal level at the D terminal of the D-type flip-flop 17b, that is, the signal level of the signal /SIGa, is reflected on the signal SIGb. Thereafter, in response to the fall of the clock signal CLK after half a cycle of the clock signal CLK, that is, after T0/4, the signal level of the signal SIGb is reflected on the signal level of SIGa.

Accordingly, the phase of the signal SIGa is retarded from that of the signal SIGb by half a cycle of the clock signal CLK. This phase lag is indicted by T0/4. Therefore, the phase difference between the signals SIGa and SIGb is π/2. The inverted signals /SIGa, /SIGb of the signals SIGa, SIGb are also output from the digital phase shifter circuit 15.

However, due to variation in turn-ON and turn-OFF time of the transistors of the flip-flop, the phase difference between the output digital signals is not necessarily accurately set to π/2. Such an effect is likely to occur particularly during high-frequency operation in which a signal cycle is reduced.

Note that the structure of the digital phase shifter 15 is not limited to that shown in FIG. 12, and any circuit structure capable of outputting the same signals as those described above as digital signals may be employed.

Referring back to FIG. 11, the phase difference correction circuit 41 includes a low pass filter 16, an adder circuit 22, and output limiter circuits 18.

The low pass filter 16 converts the rectangular-wave digital signal group output from the digital phase shifter into sinusoidal-wave signals by blunting their rising and falling edges.

The adder circuit 22 adds the outputs of the low pass filter 16. The output signals SIGOa, SIGOb, /SIGOa, /SIGOb of the adder circuit 22 pass through the corresponding output limiter circuit 18 so that their respective amplitudes are made equal to each other. As a result, the signals SIGOa' and SIGOb' having a phase difference of $\pi/2$ from each other and having the same amplitude are output from the $\pi/2$ phase shifter. The same applies to the inverted signals /SIGOa' and /SIGOb' thereof.

Thus, when the digital phase shifter is used in the phase shifter circuit of the first stage for outputting signals having different phase differences according to the input signals, the signal group having the same amplitude can be applied to the adder circuit 22 without using any input limiter circuit, whereby the phase difference between the output signals can be accurately set to $\pi/2$. This enables simplified circuit structure for accurately obtaining the phase difference of $\pi/2$.

Note that in the second to fourth embodiments, the input limiter circuit 14 and the output limiter circuit 18 may be provided in a plurality of stages for finer amplitude regulation.

The transistor elements used in the adder circuit 12, 22, input limiter circuit 14, low pass filter 16 and output limit circuit 18 are not limited to NPN transistors, and PNP transistors or field effect transistors may alternatively be used.

It should be understood that the embodiments disclosed herein are by way of illustration and example only in all respects and are not to be taken by way of limitation. The scope of the present invention is defined by the appended claims rather than the foregoing description, and it is intended by the appended claims to cover all modifications that fall within the sense and scope that are equivalent to the appended claims.

Industrial Applicability

The $\pi/2$ phase shifter of the present invention is applicable to a quadrature modulator for use in digital mobile communication terminals.

What is claimed is:

1. A $\pi/2$ phase shifter, comprising:
   a phase shifter circuit for receiving an input signal and an inverted input signal thereof and producing first and second intermediate signals having a same amplitude and being out of phase from each other, said phase shifter circuit further producing first and second inverted intermediate signals respectively corresponding to said first and second intermediate signals with their respective phases inverted; and
   a phase difference correction circuit for receiving said first and second intermediate signals produced by said phase shifter circuit and said first and second inverted intermediate signals and outputting a set of signals that are out of phase from each other by $\pi/2$, said phase difference correction circuit including an adder circuit for outputting a first output signal obtained by first addition of said first intermediate signal and said second intermediate signal, a second output signal obtained by second addition of said first intermediate signal and said second inverted intermediate signal, a third output signal obtained by third addition of said first inverted intermediate signal and said second inverted intermediate signal, and a fourth output signal obtained by fourth addition of said first inverted intermediate signal and said second intermediate signal;
   a first mixer configured to multiply the first and third output signals by in-phase signals; and
   a second mixer configured to multiply the second and fourth output signals by quadrature signals.

2. The $\pi/2$ phase shifter according to claim 1, wherein
   said phase shifter circuit outputs as analog signals said first and second intermediate signals and said first and second inverted intermediate signals, said phase difference correction circuit further including a first amplitude regulation circuit for making respective amplitudes of said first and second intermediate signals and said first and second inverted intermediate signals from said phase shifter circuit equal to each other, and
   said adder circuit conducts said first and second additions based on said first and second intermediate signals and said first and second inverted intermediate signals which are transmitted through said first amplitude regulation circuit.

3. The $\pi/2$ phase shifter according to claim 2, wherein said first amplitude regulation circuit includes
   an amplitude limiter circuit for converting said first and second intermediate signals and said first and second inverted intermediate signals from said phase shifter circuit into a plurality of rectangular wave signals having a same amplitude, and
   a low pass filter for passing therethrough said plurality of rectangular wave signals output from said amplitude limiter circuit.

4. The $\pi/2$ phase shifter according to claim 2, wherein said phase difference correction circuit further includes a second amplitude regulation circuit for making respective amplitudes of said first and second output signals from said adder circuit equal to each other.

5. The $\pi/2$ phase shifter according to claim 1, wherein
   said phase shifter circuit outputs as digital signals said first and second intermediate signals and said first and second inverted intermediate signals,
   said phase difference correction circuit further includes a low pass filter for passing therethrough said first and second intermediate signals and said first and second inverted intermediate signals which are digital signals, and
   said adder circuit conducts said first and second additions based on said first and second intermediate signals and said first and second inverted intermediate signals which are transmitted through said low pass filter.

6. The $\pi/2$ phase shifter according to claim 5, wherein said phase difference correction circuit further includes an amplitude regulation circuit for making respective amplitudes of said first and second output signals from said adder circuit equal to each other.

7. The $\pi/2$ phase shifter according to claim 1, wherein said phase difference correction circuit further includes an amplitude regulation circuit for making respective amplitudes of said first and second output signals from said adder circuit equal to each other.

8. The $\pi/2$ phase shifter according to claim 7, wherein said adder circuit includes a buffer circuit for amplifying said first and second output signals for output.

9. The $\pi/2$ phase shifter according to claim 1, wherein a vector representing the first intermediate signal, a vector representing the second intermediate signal and a vector representing the second output signal have a same magnitude.

10. A $\pi/2$ phase shifter, comprising:
    a phase shifter circuit for receiving an input signal and an inverted input signal thereof and producing first and second intermediate signals having a same amplitude and being out of phase from each other, said phase shifter circuit further producing first and second inverted intermediate signals respectively corresponding to said first and second intermediate signals with their respective phases inverted; and a phase difference correction circuit for receiving said first and second intermediate signals produced by said phase shifter circuit and said first and second inverted intermediate signals and outputting a set of signals that are out of phase from each other by π/2, said phase difference correction circuit including an adder circuit for outputting a first output signal obtained by first addition of said first intermediate signal and said second intermediate signal, and a second output signal obtained by second addition of said first intermediate signal and said second inverted intermediate signal, wherein said phase shifter circuit outputs as analog signals said first and second intermediate signals and said first and second inverted intermediate signals, said phase difference correction circuit further including a first amplitude regulation circuit for making respective amplitudes of said first and second intermediate signals and said first and second inverted intermediate signals from said phase shifter circuit equal to each other, and said adder circuit conducts said first and second additions based on said first and second intermediate signals and said first and second inverted intermediate signals which are transmitted through said first amplitude regulation circuit.

11. The π/2 phase shifter according to claim 10, wherein said first amplitude regulation circuit includes an amplitude limiter circuit for converting said first and second intermediate signals and said first and second inverted intermediate signals from said phase shifter circuit into a plurality of rectangular wave signals having a same amplitude, and a low pass filter for passing therethrough said plurality of rectangular wave signals output from said amplitude limiter circuit.

12. The π/2 phase shifter according to claim 10, wherein said phase difference correction circuit further includes a second amplitude regulation circuit for making respective amplitudes of said first and second output signals from said adder circuit equal to each other.

13. A π/2 phase shifter, comprising:

a phase shifter circuit for receiving an input signal and an inverted input signal thereof and producing first and second intermediate signals having a same amplitude and being out of phase from each other, said phase shifter circuit further producing first and second inverted intermediate signals respectively corresponding to said first and second intermediate signals with their respective phases inverted; and a phase difference correction circuit for receiving said first and second intermediate signals produced by said phase shifter circuit and said first and second inverted intermediate signals and outputting a set of signals that are out of phase from each other by π/2, said phase difference correction circuit including an adder circuit for outputting a first output signal obtained by first addition of said first intermediate signal and said second intermediate signal, and a second output signal obtained by second addition of said first intermediate signal and said second inverted intermediate signal, wherein said phase shifter circuit outputs as digital signals said first and second intermediate signals and said first and second inverted intermediate signals, said phase difference correction circuit further includes a low pass filter for passing therethrough said first and second intermediate signals and said first and second inverted intermediate signals which are digital signals, and said adder circuit conducts said first and second additions based on said first and second intermediate signals and said first and second inverted intermediate signals which are transmitted through said low pass filter.

14. The π/2 phase shifter according to claim 13, wherein said phase difference correction circuit further includes an amplitude regulation circuit for making respective amplitudes of said first and second output signals from said adder circuit equal to each other.

15. A π/2 phase shifter, comprising:

a phase shifter circuit for receiving an input signal and an inverted input signal thereof and producing first and second intermediate signals having a same amplitude and being out of phase from each other, said phase shifter circuit further producing first and second inverted intermediate signals respectively corresponding to said first and second intermediate signals with their respective phases inverted; and a phase difference correction circuit for receiving said first and second intermediate signals produced by said phase shifter circuit and said first and second inverted intermediate signals and outputting a set of signals that are out of phase from each other by π/2, said phase difference correction circuit including an adder circuit for outputting a first output signal obtained by first addition of said first intermediate signal and said second intermediate signal, and a second output signal obtained by second addition of said first intermediate signal and said second inverted intermediate signal, wherein said phase difference correction circuit further includes an amplitude regulation circuit for making respective amplitudes of said first and second output signals from said adder circuit equal to each other.

16. The π/2 phase shifter according to claim 15, wherein said adder circuit includes a buffer circuit for amplifying said first and second output signals for output.

17. A π/2 phase shifter, comprising:

a phase shifter circuit for receiving an input signal and an inverted input signal thereof and producing first and second intermediate signals having a same amplitude and being out of phase from each other, said phase shifter circuit further producing first and second inverted intermediate signals respectively corresponding to said first and second intermediate signals with their respective phases inverted; and a phase difference correction circuit for receiving said first and second intermediate signals produced by said phase shifter circuit and said first and second inverted intermediate signals and outputting a set of signals that are out of phase from each other by π/2, said phase difference correction circuit including an adder circuit for outputting a first output signal obtained by first addition of said first intermediate signal and said second intermediate signal, and a second output signal obtained by second addition of said first intermediate signal and said second inverted intermediate signal, wherein a vector representing the first intermediate signal, a vector representing the second intermediate signal and a vector representing the second output signal have a same magnitude.

* * * * *